(12) United States Patent
Atha et al.

(10) Patent No.: US 7,180,345 B2
(45) Date of Patent: Feb. 20, 2007

(54) APPARATUS AND A METHOD TO PROVIDE TIME-BASED EDGE-RATE COMPENSATION

(75) Inventors: Mohammed M. Atha, Sunnyvale, CA (US); Yanmei Tian, Sunnyvale, CA (US); Harry Muljono, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/171,574

(22) Filed: Jun. 29, 2005

(65) Prior Publication Data

US 2007/0001725 A1 Jan. 4, 2007

(51) Int. Cl.
*H03K 3/017* (2006.01)

(52) U.S. Cl. .............................. 327/172; 327/46; 327/74

(58) Field of Classification Search ...................... None
See application file for complete search history.

(56) References Cited

U.S. PATENT DOCUMENTS

| | | | | |
|---|---|---|---|---|
| 5,220,209 A | * | 6/1993 | Seymour | 326/27 |
| 5,394,020 A | * | 2/1995 | Nienaber | 327/140 |
| 5,592,111 A | * | 1/1997 | Wong et al. | 327/45 |
| 5,883,534 A | * | 3/1999 | Kondoh et al. | 327/156 |
| 6,255,860 B1 | * | 7/2001 | Chavez et al. | 327/20 |
| 6,469,493 B1 | | 10/2002 | Muething, Jr. et al. | |
| 6,535,047 B2 | * | 3/2003 | Mughal et al. | 327/378 |
| 6,542,004 B1 | | 4/2003 | Dunne | |

OTHER PUBLICATIONS

H. Muljono et al., "A 400MT/s 6.4GB/s Multiprocessor Bus Interface", ISSCC Digest of Technical Papers, Feb. 2003, p. 338 (11 pages).

J. A. Kowaleski Jr. et al., "Implementation of an Alpha Microprocessor in SOI", ISSCC Digest of Technical Papers, Feb. 2003, p. 248, (11 pages).

* cited by examiner

*Primary Examiner*—Timothy P. Callahan
*Assistant Examiner*—An T. Luu
(74) *Attorney, Agent, or Firm*—Blakely, Sokoloff, Taylor & Zafman LLP (57) ABSTRACT

A method and an apparatus to provide time-based edge-rate compensation have been disclosed. In one embodiment, the apparatus includes a reference pad, a reference circuit coupled to the reference pad, the reference circuit being operable to charge and to discharge a reference voltage at the reference pad, and an edge-rate detection and measurement circuit coupled to the reference pad to detect and to measure an edge-rate of the reference voltage at the reference pad. Other embodiments have been claimed and described.

24 Claims, 12 Drawing Sheets

--Prior Art--

Figure 3

--Prior Art--

APPARATUS AND A METHOD TO PROVIDE TIME-BASED EDGE-RATE COMPENSATION

FIELD

Embodiments of the invention relate generally to semiconductor circuits, and more particularly, to providing time-based edge-rate compensation to output signals.

BACKGROUND

Figure 1:
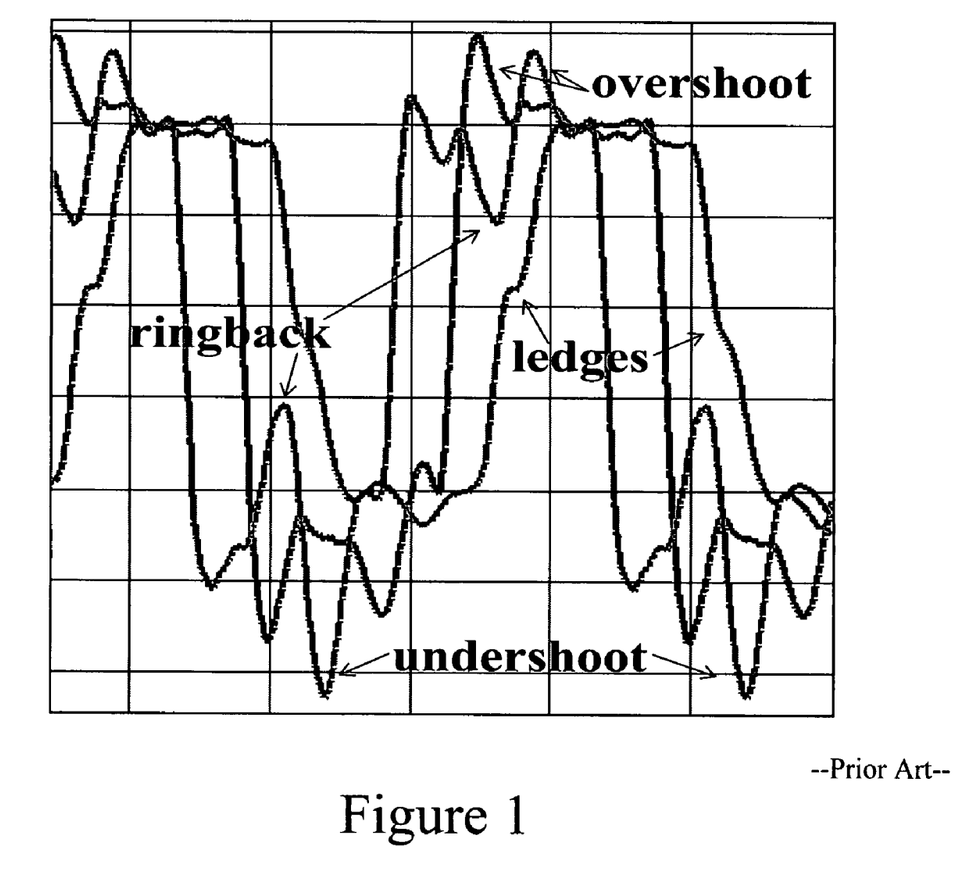
FIG. 1 shows some sample signals with a fast edge-rate.

In general, one critical property of an I/O buffer is the output edge-rate. If the edge-rate is too slow, the signal rise and fall time is too long, and thus, may not meet the frequency and timing requirement. On the other hand, as shown in FIG. 1, an edge-rate that is too fast may cause overshoot, undershoot, ring-back, and/or ledges that degrade signal integrity and may even cause functional errors in some circuits. Therefore, it is critical to keep the output edge-rate within a tightly controlled optimal range in order to meet the predetermined frequency and timing requirement and to ensure signal integrity.

Figure 2:
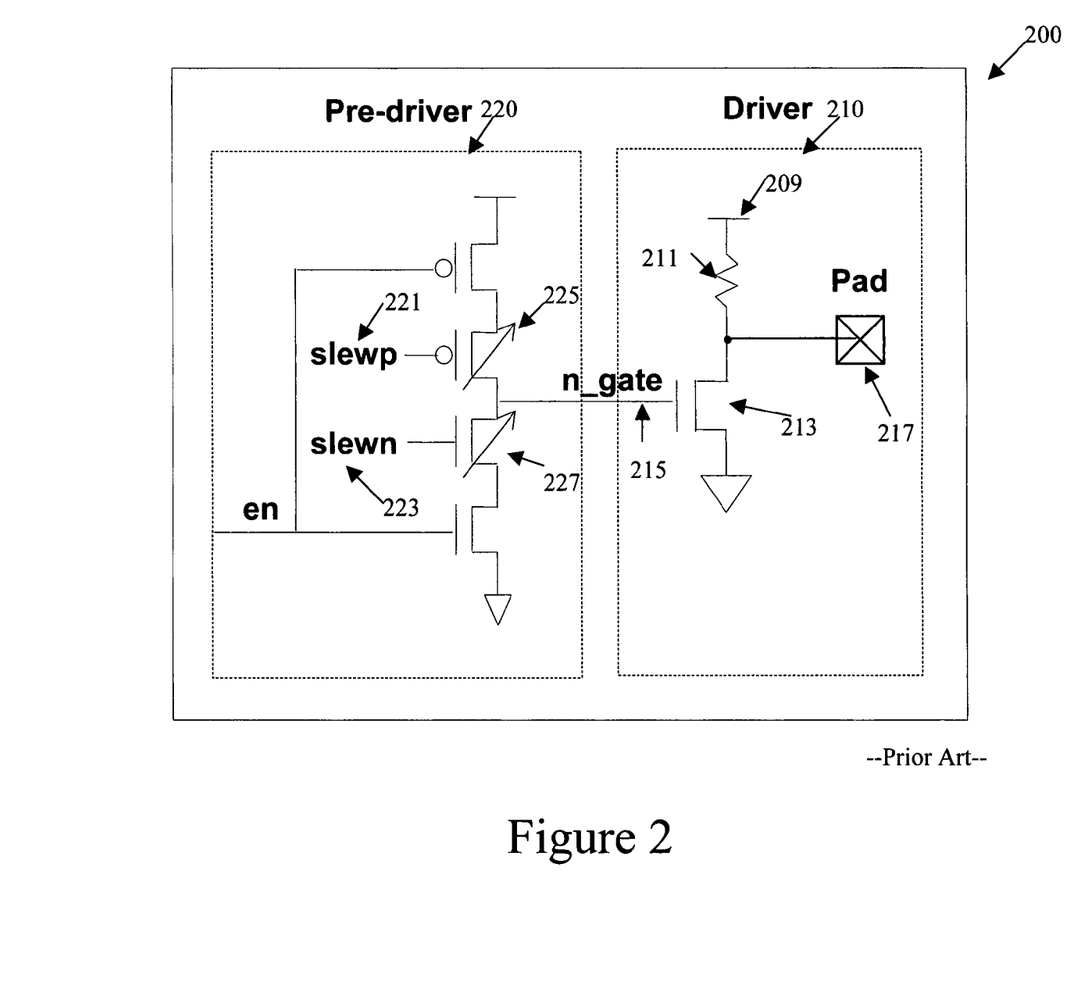
FIG. 2 shows a conventional Input/Output.

FIG. 2 illustrates a typical output buffer in an existing semiconductor device. The I/O 200 includes a driver 210 and a pre-driver 220. The driver 210 includes a pull-up resistor 211 and an n-type Metal Oxide Semiconductor (NMOS) transistor 213 coupled in series between a voltage supply 209 and the ground. A pad 217 is also coupled to the node in between the pull-up resistor 211 and the nMOS transistor 213. The gate of the NMOS transistor 213, n_gate 215, is driven by the pre-driver 220. The pre-driver 220 includes a number of p-type Metal Oxide Semiconductor (pMOS) transistors 225 and a number of nMOS transistors 227. Based on two input signals to the pre-driver 220, namely slewp 221 and slewn 223, a corresponding number of pMOS transistors 225 and a corresponding number of nMOS transistors 227 are turned on to drive n_gate 215. The signals slewp 221 and slewn 223 are from an edge-rate compensation circuit.

Figure 3:
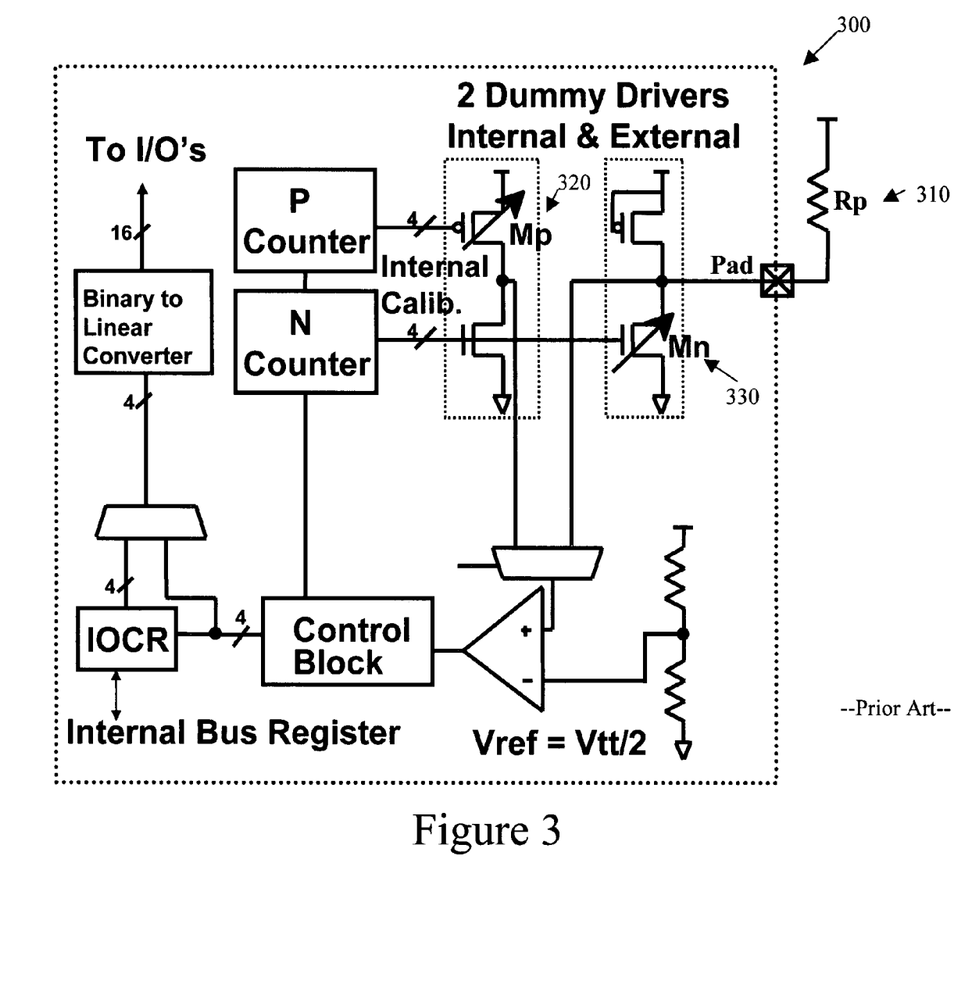
FIG. 3 shows a conventional edge-rate compensation circuit.

Currently, one typical edge-rate compensation circuit employs an approach similar to resistance or impedance compensation. FIG. 3 illustrates an existing edge-rate compensation circuit 300. As shown in FIG. 3, by referencing an off-die resistor Rp 310, the compensation circuit 300 searches and locates a digital bit setting corresponding to the number of transistor legs of Mn 330 or Mp 320, whose resistance closely matches the resistance of Rp 310. The bit setting is then sent to the output buffer pre-driver 220 in FIG. 2 to turn on the same number of pMOS and NMOS transistors 225 and 227 in the pre-driver 220 as shown in FIG. 2. In this way, the pre-driver drive strength is compensated, and hence, the edge-rate of signals at the output buffer can be controlled.

One shortcoming of this approach is that the drive strength of the pre-driver 220 is not compensated according to the capacitance at the pre-driver 220 output and driver 210 input, n_gate 215. Thus, even though the capacitance at n_gate 215 may vary with process variation, voltage, and temperature (PVT), the pre-driver 220 drives n_gate 215 with the same strength across PVT. Therefore the edge-rate at the pad 217 varies with PVT. In some cases, this approach results in a +/−15% variation in edge-rate.

Figure 4A:
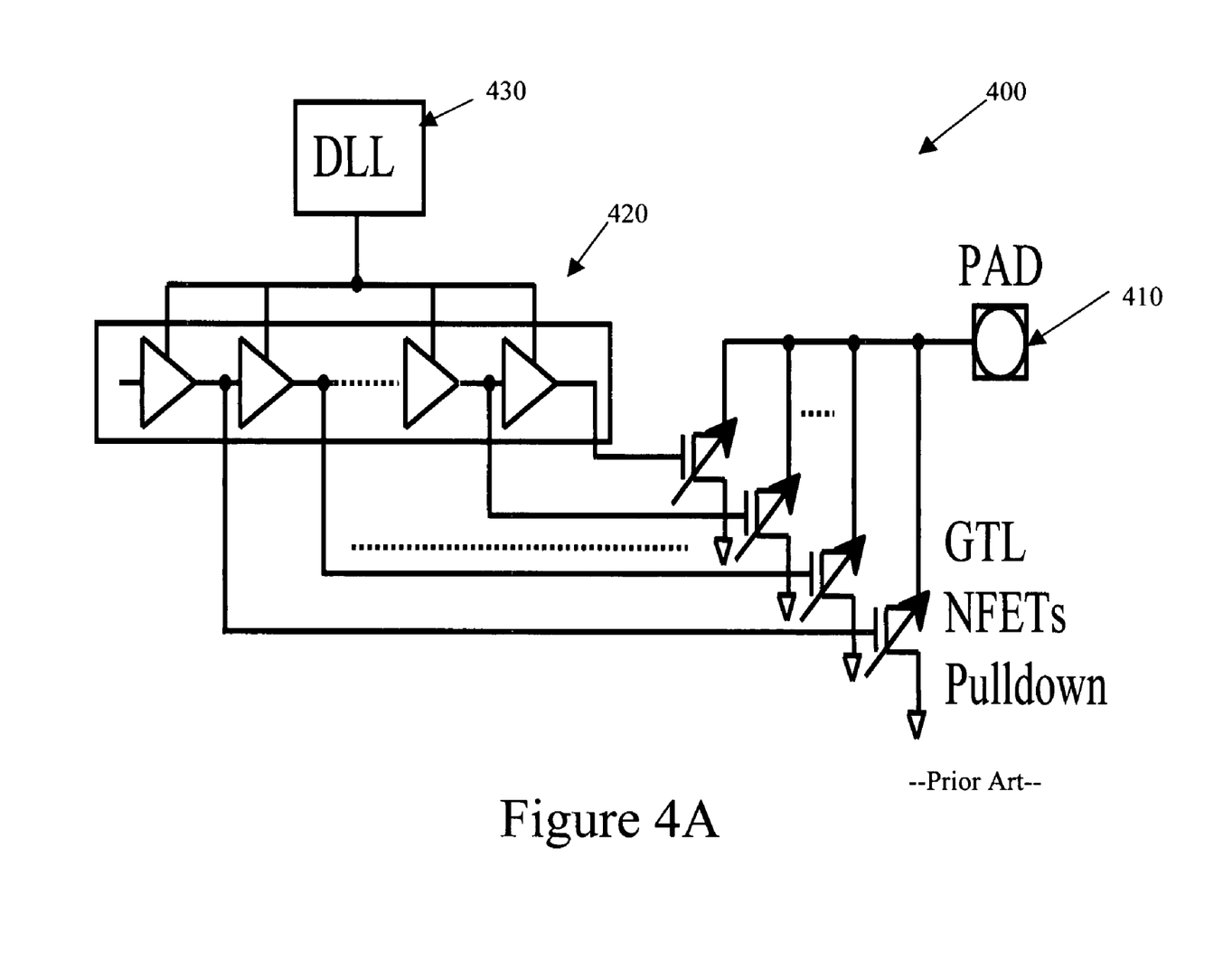
FIG. 4A shows another conventional edge-rate compensation circuit.
Figure 4B:
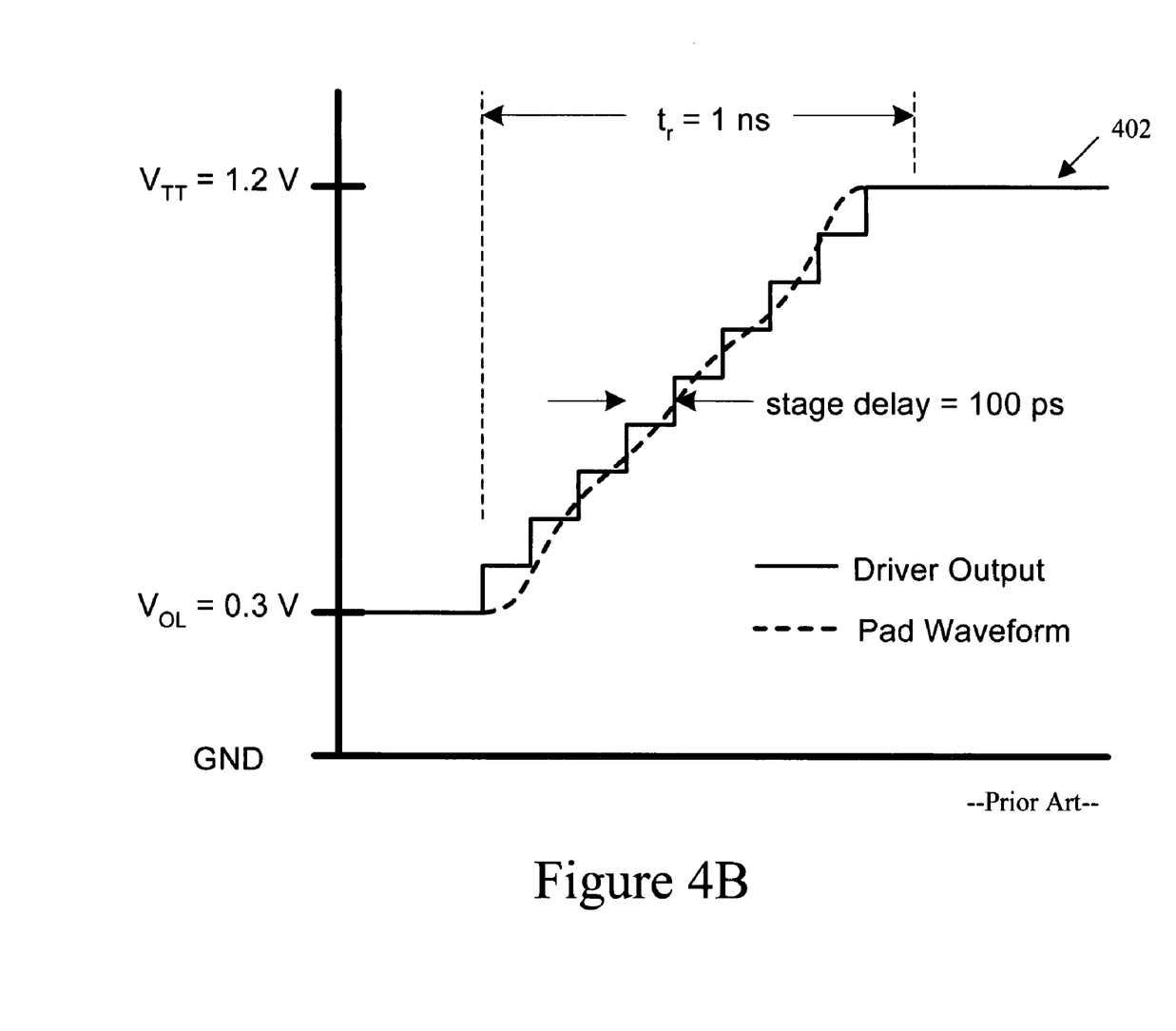
FIG. 4B shows a sample output waveform of an I/O that uses the existing edge-rate compensation circuit in FIG. 4A.

Another existing edge-rate compensation circuit utilizes an elaborate scheme which still infers the pad edge-rate based on the waveform applied to the gates of the pull-down n-type Field Effect Transistors (nFET) in the I/O driver. FIG. 4A illustrates such an edge-rate compensation circuit. Using the edge-rate compensation circuit 400, an edge-rate is determined by applying an M level staircase waveform to the pad 410. The M levels are triggered successively by some PVT compensated delay locked loop (DLL) stages 420 with a time interval of $t_r/N$ between the DLL stages 420. FIG. 4B shows the output waveform at the pad 410 with M=10 and N=9, with each of the DLL stages 420 changing the pad voltage by about 100 mV=$(V_{TT}-V_{OL})/N$. Although the edge-rate compensation circuit 400 improves slew rate control, this implementation is expensive because the edge-rate compensation circuit 400 uses the DLL 430 and a constant external frequency source to gauge the time delay. Furthermore, as the shape of the output waveform 402 is non-linear as shown in FIG. 4B and the output waveform 402 depends on the load variation at the pad 410, the edge-rate variation is relatively large, causing excessive jitter.

BRIEF DESCRIPTION OF THE DRAWINGS

Embodiments of the present invention is illustrated by way of example and not limitation in the figures of the accompanying drawings, in which like references indicate similar elements and in which.

DETAILED DESCRIPTION

A method and an apparatus for providing time-based edge-rate compensation are disclosed. In the following detailed description, numerous specific details are set forth in order to provide a thorough understanding. However, it will be apparent to one of ordinary skill in the art that these specific details need not be used to practice some embodiments of the present invention. In other circumstances, well-known structures, materials, circuits, processes, and interfaces have not been shown or described in detail in order not to unnecessarily obscure the description.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 5:
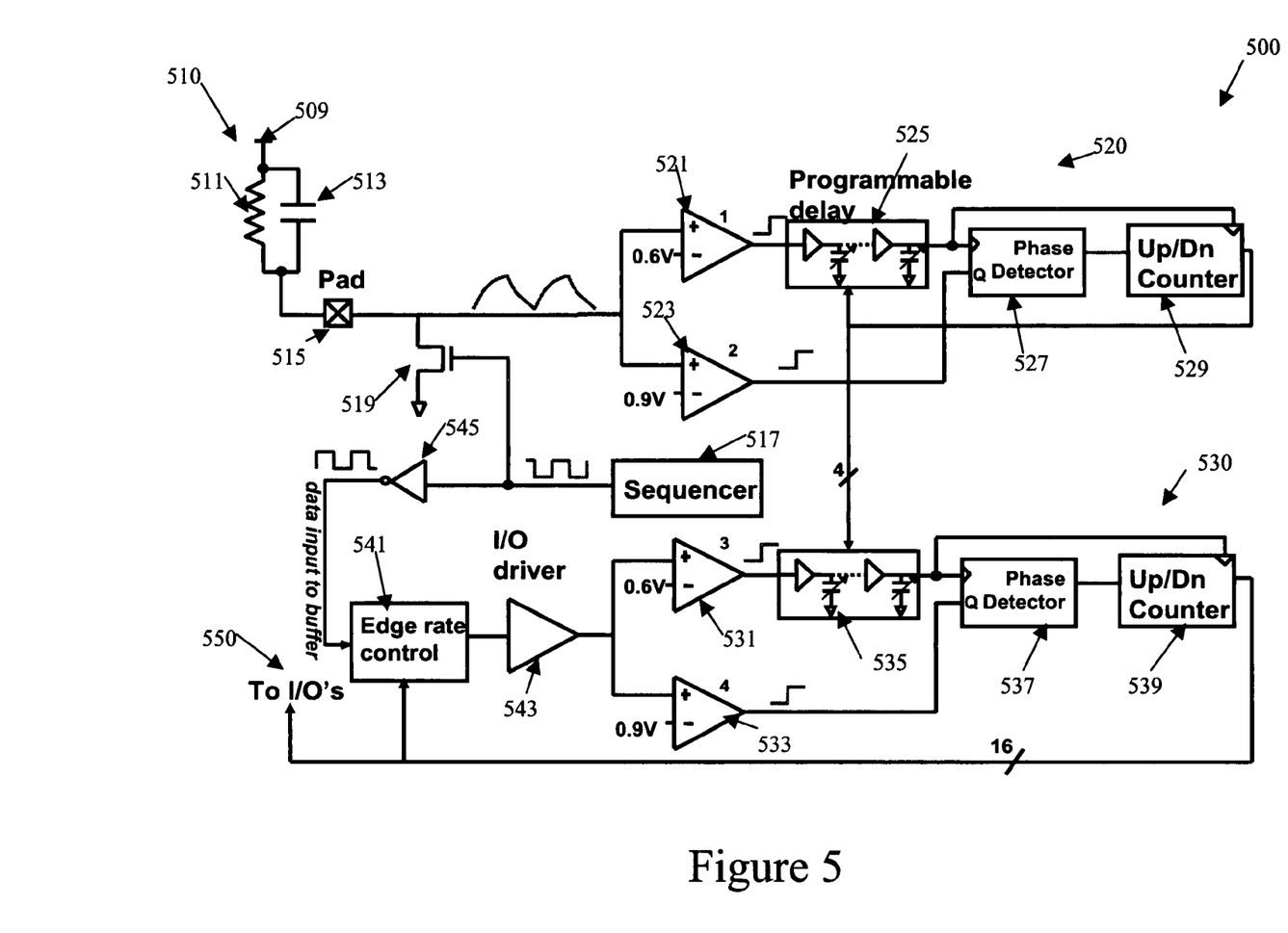
FIG. 5 illustrates one embodiment of a time-based edge-rate compensation circuit.

FIG. 5 shows one embodiment of a time-based edge-rate compensation circuit in a semiconductor device. The circuit 500 includes a reference circuit 510, a reference pad 515, a sequencer 517, an n-type Metal Oxide Semiconductor (nMOS) transistor 519, an edge-rate detection and measurement circuit 520, a replica circuit 530 of the edge-rate detection and measurement circuit 520, an Input/Output (I/O) driver 543, an edge-rate control circuit 541, and an inverter 545.

In one embodiment, the reference circuit 510 includes a resistor 511 and a capacitor 513 coupled to each other in parallel to form an RC circuit. One end of the RC circuit is coupled to a voltage supply 509 while the other end of the RC circuit is coupled to the reference pad 515. In some embodiments, the resistor 511 and the capacitor 513 are off-die, i.e., the resistor 511 and the capacitor 513 reside on different integrated circuit substrates than the rest of the time-based edge-rate compensation circuit 500.

In one embodiment, the edge-rate detection and measurement circuit 520 includes a first comparator 521, a second comparator 523, a programmable delay chain 525, a phase detector 527, and an up/down counter 529. An output of the comparator 521 is coupled to an input of the programmable delay chain 525. The output of the programmable delay chain 525 is coupled to the clock inputs of both the phase detector 527 and the up/down counter 529. The output of the second comparator 523 is coupled to the data input of the phase detector 527. The output of the phase detector 527 is coupled to the data input of the up/down counter 529. The output of the up/down counter 529 is input to the programmable delay chain 525 as a feedback. The output of the up/down counter 529 is also input to the programmable delay chain 535 of the replica circuit 530.

Alternatively, the up/down counter 529 may be replaced with a charge pump. The charge pump may capture the delay of the programmable delay element 525 in response to some analog control signals. In some embodiments, the charge pump operates with the phase detector 527 to capture the delay of the programmable delay element 525.

The replica circuit 530 of the edge-rate detection and measurement circuit 520 includes substantially identical components as the edge-rate detection and measurement circuit 520, i.e., a first comparator 531, a second comparator 533, a programmable delay chain 535, a phase detector 537, and an up/down counter 539. Moreover, the components of the replica circuit 530 are coupled to each other in a substantially similar manner as the edge-rate detection and measurement circuit 520, except that the output of the up/down counter 539 is provided to the edge-rate control circuit 541 and to the I/Os 550 of the semiconductor device. In one embodiment, two fixed voltages are input to the negative inputs of the comparators 521 and 523. For example, a voltage of approximately 0.6 V may be input to the comparator 521 and a voltage of approximately 0.9 V may be input to the comparator 523. Likewise, these voltages are input to the corresponding comparators 531 and 533 in the replica circuit 530.

Alternatively, the up/down counter 539 may be replaced with a charge pump. The charge pump may capture the delay of the programmable delay element 535 in response to some analog control signals. In some embodiments, the charge pump operates with the phase detector 537 to capture the delay of the programmable delay element 535.

In one embodiment, the sequencer 517 outputs a sequence of "1" and "0" to the nMOS transistor 519 and the inverter 545. The NMOS transistor 519 is turned on and off repeatedly by the output of the sequencer 517 to charge and discharge the voltage at the reference pad 515 repeatedly. The inverter 545 inverts the output of the sequencer 517 and provides the inverted output to the edge-rate control circuit 541. An output of the edge-rate control circuit 541 is input to the I/O driver 543. The output of the I/O driver 543 is coupled to the positive inputs of both comparators 531 and 533. More detail on the operation of the edge-rate compensation circuit 500 is discussed below using an example.

One advantage of the edge-rate compensation circuit 500 is the ability to compensate for the timing component of the signal in addition to the signal strength. By using the resistor 511 and the capacitor 513 in measuring the edge-rate at the reference pad 515, dynamic edge-rate compensation may be enabled. To illustrate this concept, the operation of the time-based edge-rate compensation circuit 500 is described in detail with respect to the measurement of the rising edge of a signal below. However, one should appreciate that substantially the same concept applies to the measurement of the falling edge of a signal as well.

In one embodiment, before the edge-rate compensation starts, the output of the sequencer 517 is "1" and the NMOS transistor 519 coupled to the reference pad 515 is turned on. The voltage at the reference pad 515 stays at an initial DC level determined by the strength ratio of the resistor 511 and the nMOS transistor 519. When the compensation circuit 500 starts to work, the output of the sequencer 517 transitions to "0" and turns off the nMOS transistor 519. Because the NMOS transistor 519 is turned off, there is no current path to the ground, the voltage at the reference pad 515 is charged up by the voltage source 509 through the reference circuit 510. The voltage source 509 may be off-die. The ramp-rate of the voltage at the reference pad 515 is determined by the delay constant of the reference circuit 510, which is the product of the resistance of the resistor 511 and capacitance of the capacitor 513.

In one embodiment, the ramp-rate of the voltage at the reference pad 515 (also referred to as the pad voltage) is detected and measured by the two comparators 521 and 523. The comparator 521 compares the pad voltage with a fixed lower voltage, such as 0.6V, and the other comparator 523 compares the pad voltage with a fixed higher voltage, such as 0.9V. The delay is captured by the programmable delay chain 525, the subsequent phase detector 527, and the up/down counter 529. The delay is then replicated in the edge-rate control circuit 541 using the replica circuit 530. In this way, the edge-rate at the output of the I/O driver 543 is substantially matched to the edge-rate at the reference pad 515, which is essentially determined by the RC delay constant of the reference circuit 510 and is substantially independent of PVT.

Figure 6A:
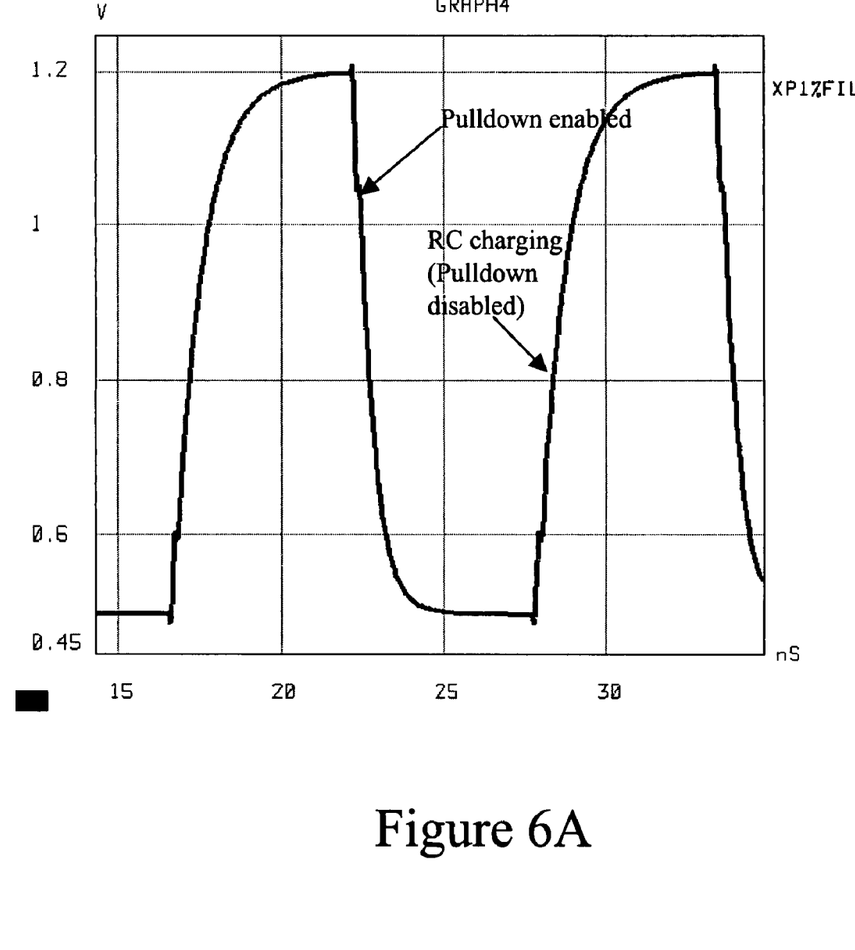
FIGS. 6A and 6B shows exemplary simulation results of one embodiment of a circuit to provide time-based edge-rate compensation.

After the pad voltage reaches the full swing, the output of the sequencer 517 transitions back to "1" and turns on the nMOS transistor 519. The pad voltage is discharged back to the initial DC level. The edge-rates of the rising and falling edges are substantially the same as shown in FIG. 6A, but only the rising edge is used in the above example for the purpose of simplifying the illustration. The time-based edge-rate compensation circuit 500 may repeat the compensation process until the sequencer 517 stops. The final edge-rate bit setting in the up/down counter 539 is then sent to the I/O buffer edge-rate control circuit 541. Therefore, the I/O buffer edge-rate controlled by the edge-rate control circuit 541 substantially matches the reference edge-rate at the reference pad 515. In some embodiments, the final edge-rate bit setting is 16-bit wide.

Figure 6B:
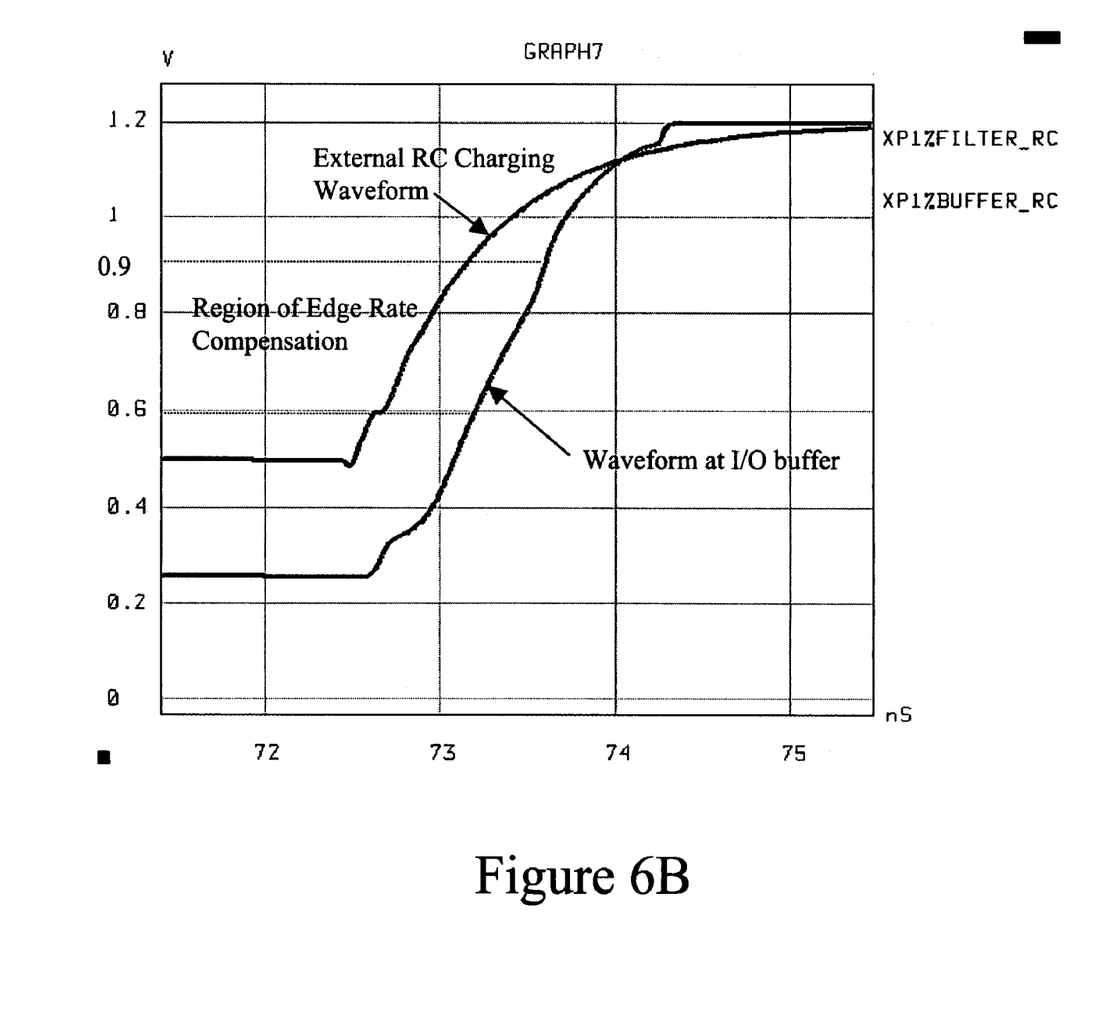

FIG. 6A shows the RC charging and discharging waveforms at the reference pad 515 from the simulation of an exemplary embodiment of a time-based edge-rate compensation circuit. FIG. 6B shows the comparison between the edge-rates at the RC output and at an I/O buffer of an exemplary semiconductor device incorporating one embodiment of the time-based edge-rate compensation circuit.

Figure 6C:
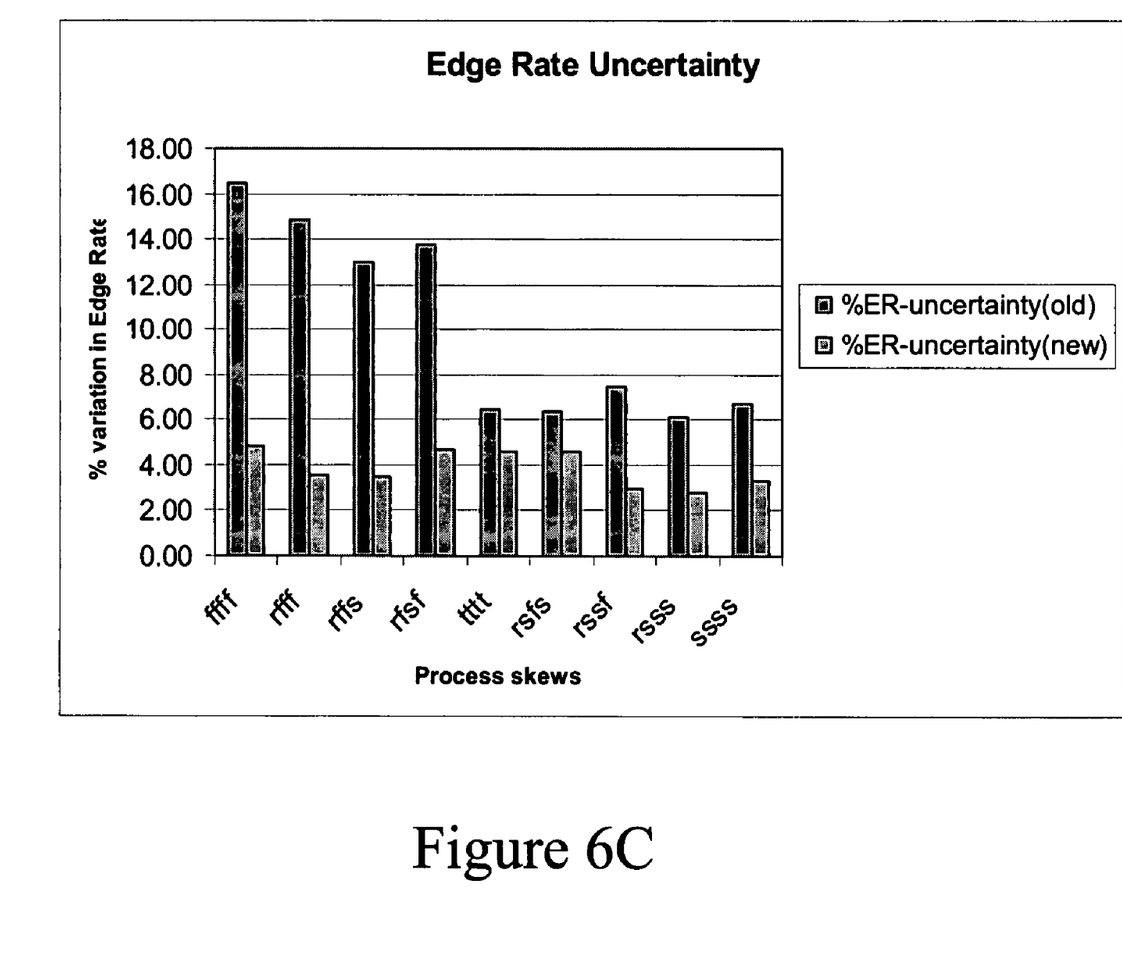
FIG. 6C shows a graph comparing the edge-rate uncertainty between one embodiment of a circuit to provide time-based edge-rate compensation and an existing circuit that provides edge-rate compensation.

As mentioned above, the time-based edge-rate compensation circuit 500 compensates both resistive and capacitive components in the edge-rate, and thus, such compensation is based on the time constant, which is essentially the product RC. This is one reason why the compensation scheme described above is referred to as a time-based edge-rate compensation circuit. In contrast, the prior edge-rate compensation technique compensates only the resistive component, not the capacitive component. Thus the edge-rate of the I/O signals in the prior compensation circuit varies with PVT. FIG. 6C shows a comparison between one embodiment of the new edge-rate compensation circuit and the prior edge-rate compensation circuit at different process skews. Using the technique described above, the edge-rate uncertainty may be reduced to 15%–30%, that is an improvement of approximately 3X across PVT conditions.

Figure 7:
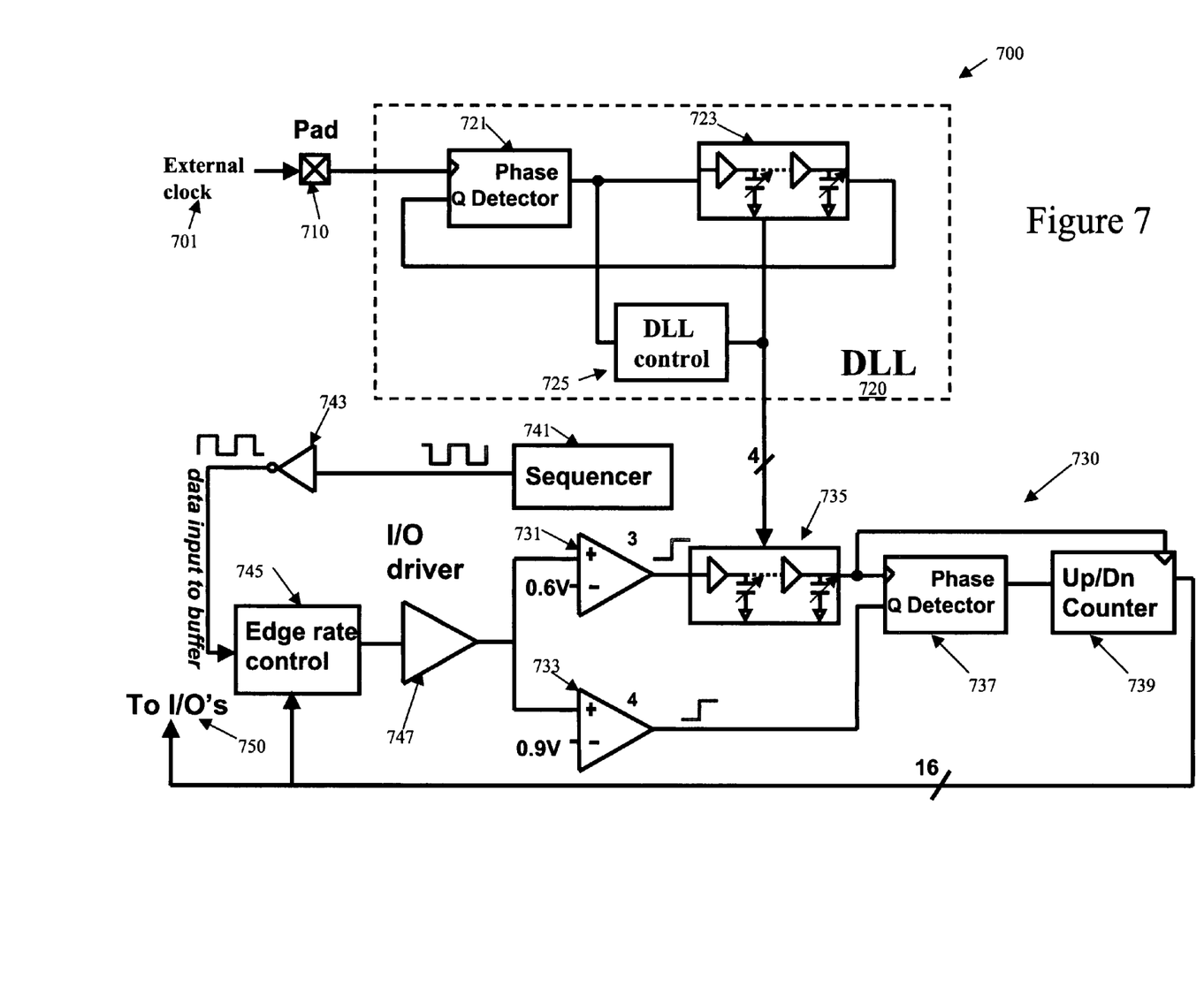
FIG. 7 illustrates an alternate embodiment of a circuit to provide time-based edge-rate compensation.

FIG. 7 shows an alternative embodiment of a time-based edge-rate compensation circuit in a semiconductor device. The time-based edge-rate compensation circuit 700 includes a reference pad 710, a delay locked loop (DLL) 720, an edge-rate detection and measurement circuit 730, a sequencer 741, an inverter 743, an edge-rate control circuit 745, and an I/O driver 747. In one embodiment, the DLL 720 includes a phase detector 721, a programmable delay chain 723, and a DLL control circuit 725. The edge-rate detection and measurement circuit 730 may include a first comparator 731, a second comparator 733, a programmable delay chain 735, a phase detector 737, and an up/down counter 739.

In one embodiment, an output of the comparator 731 is coupled to an input of the programmable delay chain 735. The output of the programmable delay chain 735 is coupled to the clock inputs of both the phase detector 737 and the up/down counter 739. The output of the second comparator 733 is coupled to the data input of the phase detector 737. The output of the phase detector 737 is coupled to the data input of the up/down counter 739. The output of the up/down counter 739 is provided to the edge-rate control circuit 745 and to the I/Os 750 of the semiconductor device. In one embodiment, two fixed voltages are input to the negative inputs of the comparators 731 and 733. For example, a voltage of approximately 0.6 V may be input to the comparator 731 and a voltage of approximately 0.9 V may be input to the comparator 733.

In one embodiment, a substantially constant external clock signal 701 is applied to the reference pad 710. The reference pad 710 is coupled to the clock input of the phase detector 721. An output of the phase detector 721 is coupled to both an input of the programmable delay chain 723 and an input of the DLL control circuit 725. A first output of the programmable delay chain 723 is coupled to the data input of the phase detector 721 as a feedback. A second output of the programmable delay chain 723 is coupled to the programmable delay chain 735 of the edge-rate detection and measurement circuit 730. The output of the DLL control circuit 725 is also coupled to the programmable delay chain 735.

Using the DLL 720 and the edge-rate detection and measurement circuit 730, the delay of the external clock signal 701 on the reference pad 710 can be adjusted to achieve a predetermined edge-rate. The corresponding setting of such a delay is output from the up/down counter 739 to the edge-rate control circuit 745 and the I/Os 750 of the semiconductor device so that the signal at the I/Os 750 can have edge-rates substantially the same as the predetermined edge-rate.

Alternatively, the up/down counter 739 may be replaced with a charge pump. The charge pump may capture the delay of the programmable delay element 735 in response to some analog control signals. In some embodiments, the charge pump operates with the phase detector 737 to capture the delay of the programmable delay element 735. Then the charge pump may output the captured delay to the edge-rate control circuit 745 and the I/Os 750.

Figure 8:
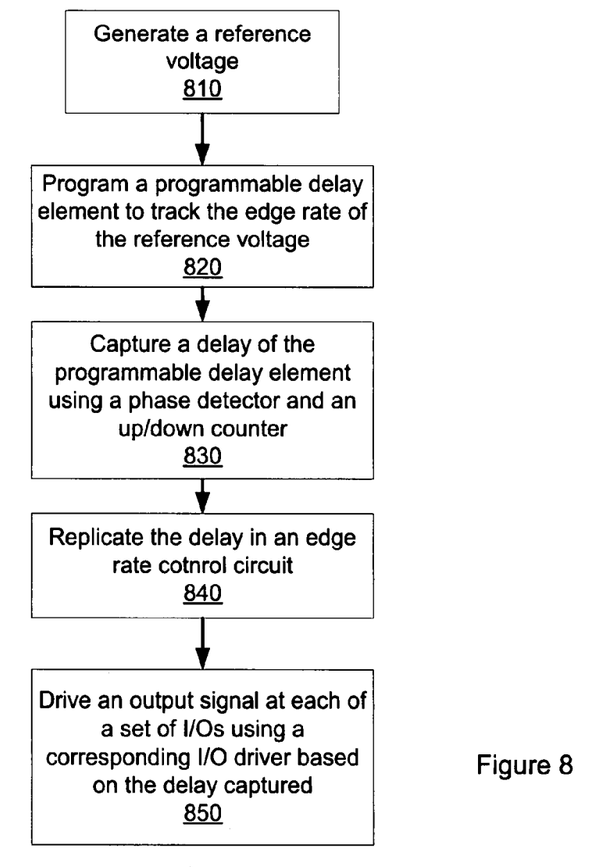
FIG. 8 shows one embodiment of a process to provide time-based edge-rate compensation.

FIG. 8 illustrates a flow diagram of one embodiment of a process to provide time-based edge-rate compensation in a semiconductor device. The process is performed by processing logic that may comprise hardware (e.g., circuitry, dedicated logic, etc.), software (such as is run on a general purpose computer system or a dedicated machine), or a combination of both.

Processing logic generates a reference voltage (processing block 810). In one embodiment, processing logic generates the reference voltage using a resistive-capacitive (RC) circuit. Then processing logic may compensate the RC component at an input of each of the I/O drivers of the semiconductor device. Alternatively, processing logic may generate the reference voltage from an external clock signal using a DLL, where the external clock signal is substantially constant.

Processing logic may perform various operations to measure the edge-rate of the reference voltage. In one embodiment, processing logic programs a programmable delay chain to track the edge-rate of the reference voltage (processing block 820). Processing logic may capture the delay of the programmable delay chain using a phase detector and an up/down counter (processing block 830). Alternatively, processing logic may capture the delay of the programmable delay chain using a phase detector and a charge pump in response to some analog control signal(s). Processing logic may further replicate the delay in an edge-rate control circuit (processing block 840).

After measuring the edge-rate of the reference voltage, processing logic may match the edge-rate of the signal output at each I/O driver with the edge-rate of the reference voltage. In one embodiment, processing logic matches the edge-rates by driving an output signal at each I/O pads using a corresponding I/O driver in the semiconductor device based on the delay captured (processing block 850).

Embodiments of the process to provide time-based edge-rate compensation may be performed by a processor in response to instructions embodied on a machine-accessible medium. A machine-accessible medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Figure 9:
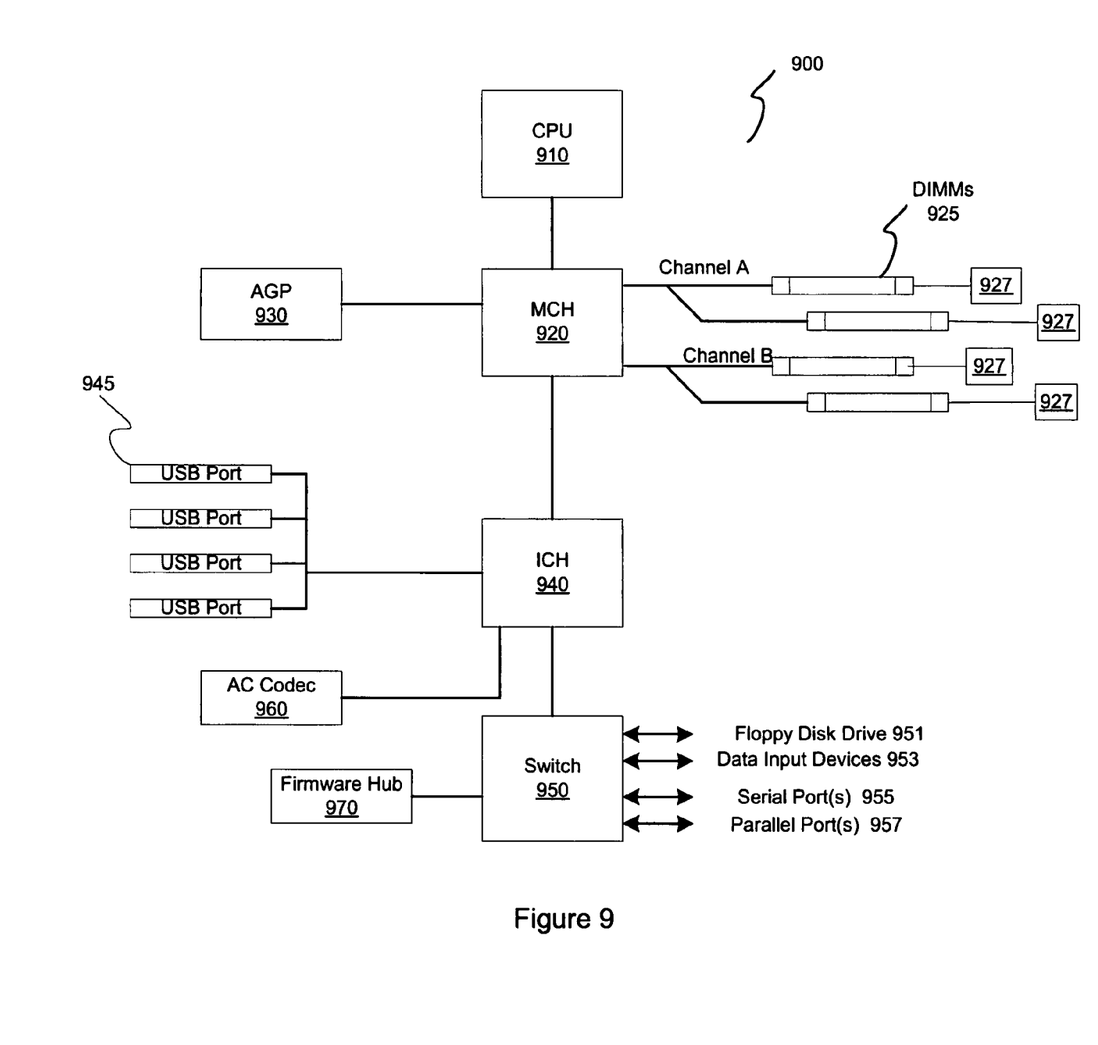
FIG. 9 shows an exemplary embodiment of a computing system.

FIG. 9 shows an exemplary embodiment of a computing system 900. The computing system 900 includes a central processing unit (CPU) 910, a memory controller (MCH) 920, a number of dual in-line memory modules (DIMMs) 925, a number of memory devices 927, an advance graphics port (AGP) 930, an input/output controller (ICH) 940, a number of Universal Serial Bus (USB) ports 945, an audio converter co-decoder (AC Codec) 960, a switch 950, and a firmware hub 970.

In one embodiment, the CPU 910, the AGP 930, the DIMMs 925, and the ICH 940 are coupled to the MCH 920. The MCH 920 routes data to and from the memory devices 927 via the DIMMs 925. The memory devices 927 may include various types of memories, such as, for example, dynamic random access memory (DRAM), synchronous dynamic random access memory (SDRAM), double data rate (DDR) SDRAM, or flash memory. In one embodiment, each of the DIMMs 925 is mounted on the same motherboard (not shown) via a DIMM connector (not shown) in order to couple to the MCH 920. In one embodiment, the USB ports 945, the AC Codec 960, and the switch 950 are coupled to the ICH 940. The switch 950 may be further coupled to a firmware hub 970, a floppy disk drive 951, data input devices 953, such as, a keyboard, a mouse, etc., a number of serial ports 955, and a number of parallel ports 957.

Note that any or all of the components and the associated hardware illustrated in FIG. 9 may be used in various embodiments of the computing system. Some embodiments of the computing system may include more or less components than those shown in FIG. 9. However, it should be appreciated that other configuration of the computing system may include one or more additional devices not shown in FIG. 9. Furthermore, one should appreciate that the technique disclosed is applicable to different types of system environment, such as a multi-drop environment or a point-to-point environment.

In one embodiment, the CPU 910 includes a time-based edge-rate compensation circuit to compensate for edge-rate slews in the I/O signals output by the CPU 910. Some embodiments of the time-based edge-rate compensation circuit have been described above.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. An apparatus comprising:
   a reference pad;
   a reference circuit coupled to the reference pad, the reference circuit being operable to charge and to discharge a reference voltage at the reference pad, wherein the reference circuit comprises
      a resistor coupled between the reference pad and a voltage supply,
      a capacitor coupled in parallel with the resistor and coupled between the reference pad and the voltage supply, and
      a delay locked loop to output a control signal based on a substantially constant reference clock signal; and
   an edge-rate detection and measurement circuit coupled to the reference pad to detect and to measure an edge-rate of the reference voltage at the reference pad, comprising a delay element coupled to the delay locked loop to provide a substantially constant delay in response to the control signal.

2. The apparatus of claim 1, further comprising:
   a sequencer coupled to the reference pad, wherein the reference circuit charges or discharges the reference voltage at the reference pad in response to an output of the sequencer.

3. The apparatus of claim 1, wherein the edge-rate detection and measurement circuit comprises:
   a first comparator having a first input and a second input, the first input being coupled to the reference pad and the second input receives a first input voltage; and
   a second comparator having a third input and a fourth input, the third input being coupled to the reference pad and the fourth input receives a second input voltage, the second input voltage being higher than the first input voltage.

4. An apparatus, comprising:
   a reference pad;
   a reference circuit coupled to the reference pad, the reference circuit being operable to charge and to discharge a reference voltage at the reference pad; and
   an edge-rate detection and measurement circuit coupled to the reference pad to detect and to measure an edge-rate of the reference voltage at the reference pad, wherein the edge-rate detection and measurement circuit comprises
      a first comparator having a first input and a second input, the first input being coupled to the reference pad and the second input receives a first input voltage;
      a second comparator having a third input and a fourth input, the third input being coupled to the reference pad and the fourth input receives a second input voltage, the second input voltage being higher than the first input voltage; and
      a programmable delay chain having a first input, a second input, and an output, the first input of the programmable delay chain being coupled to an output of the first comparator.

5. The apparatus of claim 4, wherein the edge-rate detection and measurement circuit further comprises:
   a phase detector having a clock input and a data input, the clock input being coupled to the output of the programmable delay chain and the data input being coupled to an output of the second comparator.

6. The apparatus of claim 5, wherein the edge-rate detection and measurement circuit further comprises:
   a charge pump coupled to the phase detector to capture a delay of the programmable delay chain in response to one or more analog control signals.

7. The apparatus of claim 5, wherein the edge-rate detection and measurement circuit further comprises:
   an up/down counter having a clock input, a data input, and an output, the clock input of the up/down counter being coupled to the output of the programmable delay chain, the data input of the up/down counter being coupled to an output of the phase detector, and the output of the up/down counter being coupled to the second input of the programmable delay chain.

8. The apparatus of claim 7, further comprising:
   at least one edge-rate control circuit coupled to the edge-rate detection and measurement circuit; and
   at least one Input/Output (I/O) driver coupled to the at least one edge-rate control circuit, wherein the edge-rate control circuit matches an edge-rate of an output of the at least one I/O driver to the edge-rate of the reference voltage at the reference pad in response to the output of the up/down counter.

9. A method, comprising:
   measuring an edge-rate of a reference voltage at a reference pad;
   matching an edge-rate of a signal output by each of a plurality of Input/Output (I/O) drivers with the edge-rate of the reference voltage at the reference pad; and
   programming a delay chain to track the edge-rate of the reference voltage.

10. The method of claim 9, further comprising:
   generating the reference voltage using a resistive-capacitive (RC) circuit having a resistor and a capacitor coupled to each other in parallel, the RC circuit coupled between the reference pad and a power supply.

11. The method of claim 9, further comprising:
compensating a resistive component and a capacitive component at an input of each of the plurality of I/O drivers.

12. The method of claim 9, further comprising:
generating the reference voltage from a substantially constant clock signal using a delay locked loop.

13. The method of claim 9, further comprising capturing a delay of the delay chain using a phase detector and a charge pump in response to one or more analog control signals.

14. The method of claim 9, further comprising capturing a delay of the delay chain using a phase detector and an up/down counter.

15. The method of claim 14, further comprising:
replicating the delay in an edge-rate control circuit.

16. The method of claim 15, wherein matching the edge-rate of the signal output by each of the plurality of I/O drivers with the edge-rate of the reference voltage comprises:
driving an output signal at each of a plurality of Input/Output (I/O) pads using a corresponding I/O driver of the plurality of I/O drivers based on the delay.

17. A system comprising:
a codec;
a memory controller coupled to the codec; and
a processor coupled to the memory controller, the processing having a plurality of Input/Outputs (I/Os) and an edge-rate calibration circuit, the edge-rate calibration circuit comprising
a reference pad;
a reference circuit coupled to the reference pad, the reference circuit being operable to charge and to discharge a reference voltage at the reference pad, wherein the reference circuit comprises
a resistor coupled between the reference pad and a voltage supply,
a capacitor coupled in parallel with the resistor and coupled between the reference pad and the voltage supply, and
a delay locked loop to output a control signal based on a substantially constant reference clock signal; and
an edge-rate detection and measurement circuit coupled to the reference pad to detect and to measure an edge-rate of the reference voltage at the reference pad, comprising a delay element coupled to the delay locked loop to provide a substantially constant delay in response to the control signal.

18. The system of claim 17, wherein the edge-rate detection and measurement circuit comprises:
a first comparator having a first input and a second input, the first input being coupled to the reference pad and the second input receives a first input voltage; and
a second comparator having a third input and a fourth input, the third input being coupled to the reference pad and the fourth input receives a second input voltage, the second input voltage being higher than the first input voltage.

19. A system, comprising:
a codec;
a memory controller coupled to the codec; and
a processor coupled to the memory controller, the processing having a plurality of Input/Outputs (I/Os) and an edge-rate calibration circuit, the edge-rate calibration circuit comprising
a reference pad;
a reference circuit coupled to the reference pad, the reference circuit being operable to charge and to discharge a reference voltage at the reference pad; and
an edge-rate detection and measurement circuit coupled to the reference pad to detect and to measure an edge-rate of the reference voltage at the reference pad, wherein the edge-rate detection and measurement circuit comprises:
a first comparator having a first input and a second input, the first input being coupled to the reference pad and the second input receives a first input voltage,
a second comparator having a third input and a fourth input, the third input being coupled to the reference pad and the fourth input receives a second input voltage, the second input voltage being higher than the first input voltage, and
a programmable delay chain having a first input, a second input, and an output, the first input of the programmable delay chain being coupled to an output of the first comparator.

20. The system of claim 19, wherein the edge-rate detection and measurement circuit comprises:
a phase detector having a clock input and a data input, the clock input being coupled to the output of the programmable delay chain and the data input being coupled to an output of the second comparator.

21. The system of claim 20, wherein the edge-rate detection and measurement circuit comprises:
a phase detector having a clock input and a data input, the clock input being coupled to the output of the programmable delay chain and the data input being coupled to an output of the second comparator.

22. The system of claim 21, wherein the edge-rate detection and measurement circuit comprises:
a charge pump coupled to the phase detector to capture a delay of the programmable delay chain in response to one or more analog control signals.

23. The system of claim 21, wherein the edge-rate detection and measurement circuit comprises:
an up/down counter having a clock input, a data input, and an output, the clock input of the up/down counter being coupled to the output of the programmable delay chain, the data input of the up/down counter being coupled to an output of the phase detector, and the output of the up/down counter being coupled to the second input of the programmable delay chain.

24. The system of claim 23, wherein the edge-rate calibration circuit further comprises:
at least one edge-rate control circuit coupled to the edge-rate detection and measurement circuit; and
at least one Input/Output (I/O) driver coupled to the at least one edge-rate control circuit, wherein the edge-rate control circuit matches an edge-rate of an output of the at least one I/O driver to the edge-rate of the reference voltage at the reference pad in response to the output of the up/down counter.

* * * * *